United States Patent
Cha et al.

(10) Patent No.: US 6,376,360 B1
(45) Date of Patent: Apr. 23, 2002

(54) EFFECTIVE RETARDATION OF FLUORINE RADICAL ATTACK ON METAL LINES VIA USE OF SILICON RICH OXIDE SPACERS

(75) Inventors: Randall Cher Liang Cha; Tae Jong Lee, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 74 days.

(21) Appl. No.: 09/641,390

(22) Filed: Aug. 18, 2000

(51) Int. Cl.[7] .......................................... H01L 21/4763
(52) U.S. Cl. ...................... 438/624; 438/622; 438/778; 438/761; 438/787
(58) Field of Search ................................ 438/622, 624, 438/761, 763, 778, 783, 784, 787, 902

(56) References Cited

U.S. PATENT DOCUMENTS

| | | | |
|---|---|---|---|
| 5,578,524 A | 11/1996 | Fukase et al. | 437/195 |
| 5,668,052 A * | 9/1997 | Matsumoto et al. | 438/624 |
| 5,756,396 A | 5/1998 | Lee et al. | 438/622 |
| 5,807,785 A | 9/1998 | Ravi | 438/624 |
| 5,907,781 A * | 5/1999 | Chen et al. | 438/303 |
| 5,937,323 A | 8/1999 | Orczyk et al. | 438/624 |
| 6,037,251 A | 3/2000 | Tu et al. | 438/626 |
| 6,054,394 A * | 4/2000 | Wang | 438/738 |
| 6,211,097 B1 * | 4/2001 | Chen et al. | 438/759 |
| 6,218,284 B1 * | 4/2001 | Liu et al. | 438/435 |

* cited by examiner

Primary Examiner—Caridad Everhart
Assistant Examiner—Craig P. Lytle
(74) Attorney, Agent, or Firm—George O. Saile; Rosemary L. S. Pike

(57) ABSTRACT

A process for forming metal structures, encapsulated in silicon rich oxide, (SRO), shapes and layers, needed to protect the metal structures from the corrosive effects of fluorine radicals, present in low k, fluorinated silica glass, (FSG), which in turn is formed in the spaces between metal structures, has been developed. The process features initial formation of the metal structures, capped with an overlying SRO shape. This is followed by the formation of SRO spacers on the sides of the SRO capped, metal structures. Another thin, conformal SRO layer is then deposited to insure encapsulation of the metal structures, however still leaving adequate space between the SRO encapsulated metal structures for the low k FSG layer, needed to limit capacitance and improve device performance.

22 Claims, 2 Drawing Sheets

EFFECTIVE RETARDATION OF FLUORINE RADICAL ATTACK ON METAL LINES VIA USE OF SILICON RICH OXIDE SPACERS

BACKGROUND OF THE INVENTION

(1) Field of the Invention

The present invention relates to methods used to fabricate semiconductor devices, and more specifically to a method used to protect metal interconnect structures from fluorine evolving from adjacent dielecic layers.

(2) Description of Prior Art

The semiconductor industry is continually striving to increase device performance via decreases in RC delays. In addition, an objective of decreasing cost has led to the development of semiconductor chips comprised with sub-100 nm features, allowing a greater number of smaller chips to be obtained from a specific size starting substrate, thus reducing the processing cost of a specific chip. The use of high conductivity aluminum or copper, for metal interconnect structures, as well as the use of low dielectric constant, (low k), layers, have greatly contributed to the desired decreases in the RC, (resistance—capacitance), delays. An easily obtainable, low k layer, used in the sub-100 nm devices, is fluorinated silica glass, (FSG), featuring a dielectric constant as low as 2 to 3. However the fluorine radicals, contained in the FSG layer, can out diffuse during subsequent processing and attack adjacent metal lines, resulting in corrosion of, or unwanted resistance increases of, the high conductivity copper interconnect structures. One method used to protect the metal, or copper structures from fluorine attack is the use of a silicon rich oxide, (SRO), layer, used to line or coat the metal structures prior to deposition of the low k, FSG layer. The SRO layer also provides protection to the gate oxide during plasma processing used during subsequent intermetal deposition, (IMD), procedures. However to adequately protect the metal lines a thick SRO layer is needed, possibly filling the narrow spaces between metal structures, therefore leaving little space available for the low k FSG layer. Therefore the objective of using a low k layer between metal lines to reduce capacitance, is negated via the filling of these narrow spaces with a higher dielectric constant, SRO layer.

This invention will describe a novel procedure for forming SRO on the surfaces of high conductivity metal interconnect structure, however still leaving adequate space between the metal interconnect structures, for placement of the low k FSG layer. Prior art, such as Lee et al, in U.S. Pat. No, 5,756,396, describe spacer formation, applied to a metal line, however that prior art does not show the novel procedure described in the present invention in which three SRO layers are used to form the needed protection on the surfaces of metal lines, without filling the narow space between the metal lines.

SUMMARY OF THE INVENTION

It is an object of this invention to fill narrow spaces between metal interconnect structures with a low k layer.

It is another object of this invention to protect the metal interconnect strutures from fluorine radicals emitted from the low k layer, via use of silicon rich oxide, (SRO), layers formed on the surfaces of the metal structures.

It is still another object of this invention to use a combination of SRO deposition and etch procedures, to form the protective SRO layers and shapes on the surface of the metal interconnect structures, still however leaving adequate space between the metal interconnects structures for filling by a low k layer.

In accordance with the present invention a method of forming silicon rich oxide, (SRO), layers and shapes on the surfaces of metal interconnect structures, to protect the metal interconnect structures from fluorine radicals emitted from a low A, fluorinated silica glass layer, located in the spaces between metal interconnect structures, has been developed. After deposition of a metal layer, and an overlying, first SRO layer, a patterning procedure is employed to form the metal interconnect structures, comprised with an overlying capping SRO layer. A thin, second SRO layer is deposited, then subjected to a anisotropic, reactive ion etching, (RIE), procedure to form a thin SRO spacer on the sides of the SRO capped, metal interconnect sutures. A thin, third SRO layer is next deposited, conformally coating the SRO capped metal interconnect structures, and the SRO spacers, still leaving space between these structures. A low k, FSG layer is then deposited, filing the space between the metal interconnect structures, protected by, an overlying SRO capping layer, the thin SRO spacers, and the thin conformal SRO layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
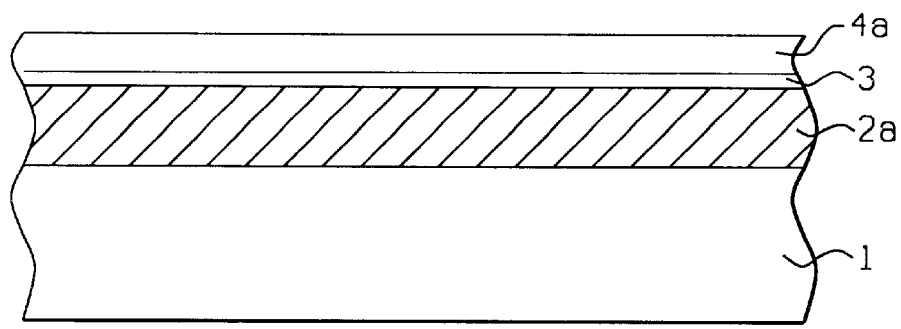
FIGS. 1–5, which schematically in cross-sectional style, show key stages of fabrication used to form protective SRO layers and shapes on the surfaces of metal interconnect structures, prior to deposition of a low k, FSG layer, which overlays, as well as fills the spaces between, the metal interconnect structures.
Figure 2:
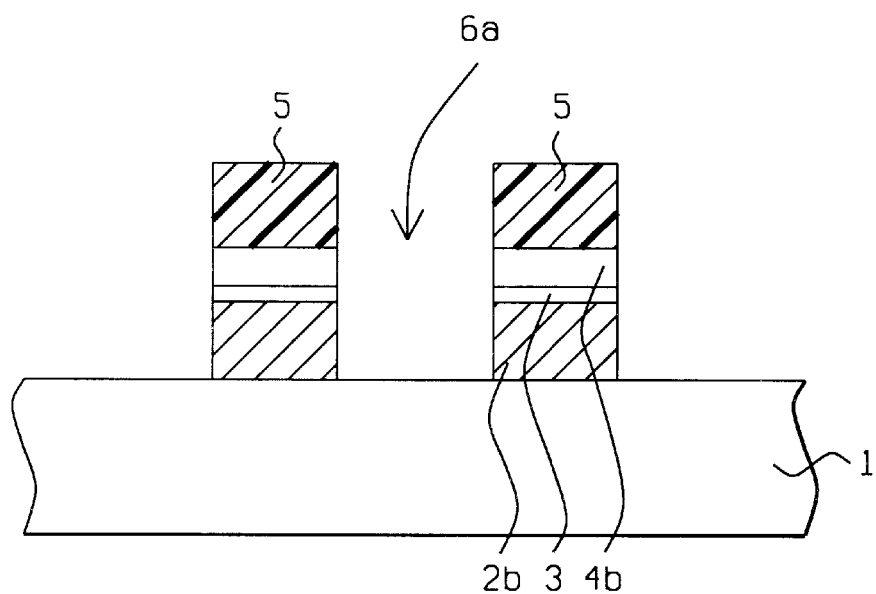

The method of forming thin, protective silicon rich oxide, (SRO), layers and shapes on the surfaces of copper interconnect structures, to protect the copper structures from fluorine radicals present in a low k, fluorinated silica mass, (FSG), layer, located on, and between the copper interconnect structures, will now be described in detail. A conducive region 1, such as heavily doped source/drain regions in a semiconductor substrate, or conductive region such as a lower level metal interconnect, or plug structure, is shown schematically on FIG. 1. metal layer 2a, comprised of copper, obtained via plasma vapor deposition, (PVD), or via electrochemical plating procedures, is formed on conductive region 1, at a thickness between about 4000 to 6000 Angstroms. Metal layer 2a, can also be comprised of aluminum, or aluminun—copper, if desired, again formed to a thickness between about 6000 to 8000 Angstroms, via PVD procedures. An anti-reflective coating, (ARC), 3, such as silicon nitride, or titanium nitride, is next deposited on metal layer 2a, at a thickness between about 200 to 400 Angstroms via either a plasma enhanced chemical vapor deposition, (PECVD), or a low pressure chemical vapor deposition, (LPCVD), procedure. Finally a first silicon rich oxide, (SRO), layer 4a, to se as a dielectric anti-reflective coating, is deposited via PECVD or LPCVD procedures, to a thickness between about 300 to 500 Angstroms. SRO layer 4a can be comprised of $SiO_2$ or $Si_3N_4$, obtained at a temperature between about 400 to 500° C., at a pressure between about 4 to 8 torr, at an RF power between about 100 to 200 wa,ts, using silane, an oxygen source such as $O_2$ or $O_3$, and a nitrogen source such as $N_2$, $NH_3$, NO, or $N_2O$, as reactants. This is schematically shown in FIG. 1. SRO layer 4a, will protect the top surface of a subsequent metal structure from attack by fluorine radicals, present in an overlying, low k, FSG layers.

Photoresist shapes 5, are next employed as an etch mask, allowing an anisotropic reactive ion etching, (RIE), procedure to define the desired metal structures 2b, shown schematically in Fig, 2. The RIE procedure is performed using $CHF_3$ or $CF_4$ as an etchant for SRO layer 4a, and for ARC layer 3, while $Cl_2$ or $SF_6$ is used as an etchant for metal layer 4a. Defined metal structures 2b, again comprised of copper or aluminum, are protected by SRO capping shape 4b. Space 6a, between metal structures 2b, is between about 0.15 to 0.25 um. Photoresist shapes 5, are then removed via plasma oxygen ashing and careful wet cleans.

Figure 3:
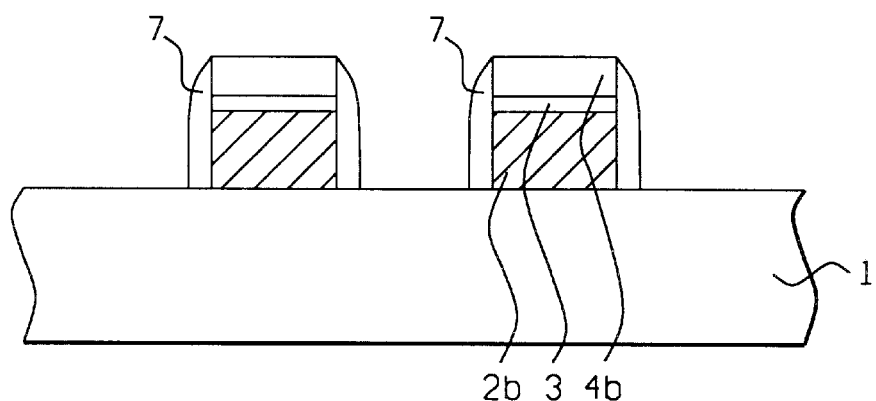

Protection of the sides of metal structures 2b, from attack from a subsequent, adjacent, FSG layer, is next addresses and schematically shown in FIGS. 3, Since space 6a, between metal structures 2b, is narrow, SRO protection on the sides of metal structures 2b, has to be thin, allowing adequate room for the needed, low k layer. If SRO spacers, formed on the sides of metal strictures 2b, are thick, the high dielectric constant of SRO, between about 4 to 7, would result in unwanted capacitance increases. Therefore a thin, second SRO layer is deposited at a thickness between about 150 to 300 Angstroms, using PECVD or LPCVD procedures. A blanket, anisotropic RIE procedure, using $CHF_3$ or $CF_4$ as an etchant, is then used to form SRO spacers 7, on the sides of metal structures 2b. This is schematically shown in FIG. 3.

Figure 4:
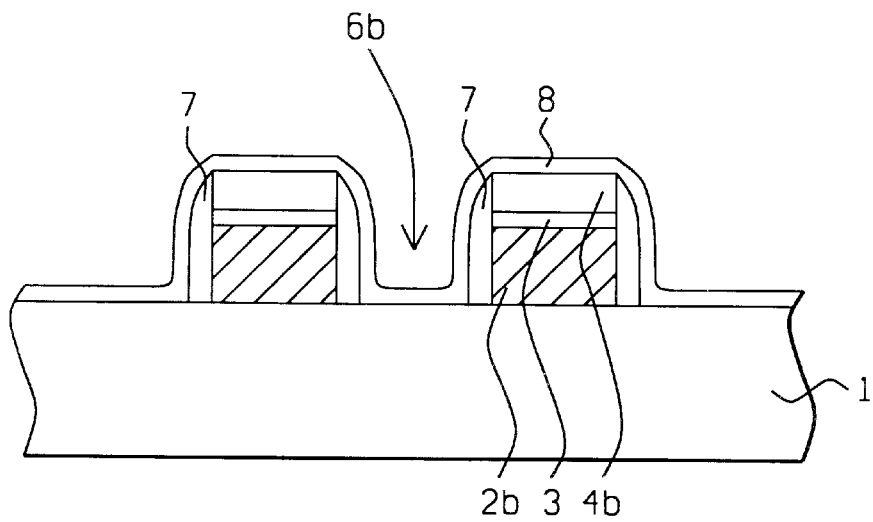

To insure SRO protection at the corners or edges of metal structure 2b, a thin third SRO layer 8, is conforrnaly deposited, again via PECVD or LPCVD procedures, at a thickness between about 150 to 300 Angstroms. The addition of SRO spacers 7, as well as the addition of third SRO layer 8, on the sides of metal structures 2b, result in a narrowing of the space between metal structures 2b. Space 6b, between about 0.10 to 0.19 um, is still wide enough to accommodate, or to be filled by the low k dielectric layer. This is schematically shown in FIG. 4.

Figure 5:
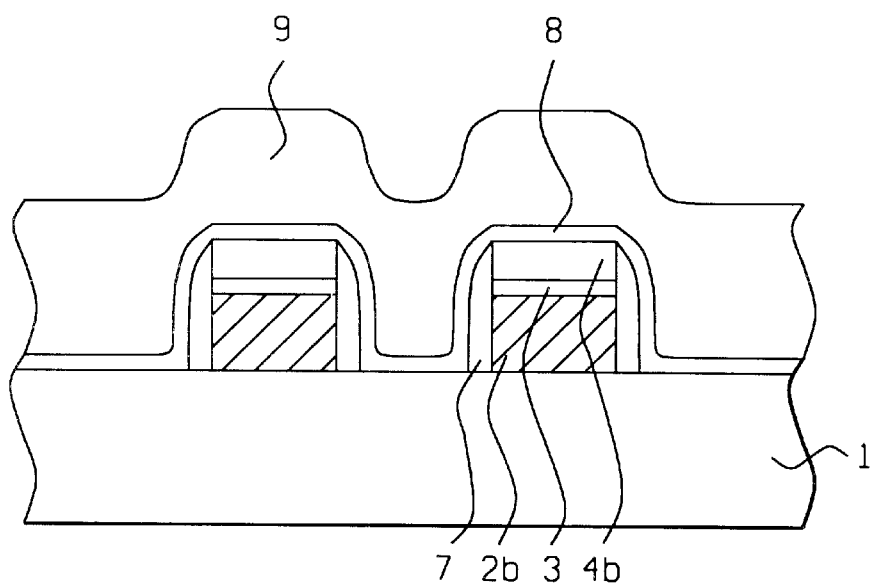

The combination of SRO capping shape 4b, SRO spacers 7, and conformal SRO layer 8, offers the needed protection for metal structures 2b, from low k, fluorinated silica glass, (FSG), layer 9, shown schematically in FIG. 5. FSG layer 9, with a dielectric constant between about 2 to 3, is obtained via PECVD procedures, at a thickness between about 5000 to 8000 Angstroms completely filling space 6a. The needed, low k, FSG layer 9, occupying a large portion of the space between metal structures 2b, supplies the desired low k layer, needed to reduce capacitance and thus improve device performance. The fluorine radicals present in FSG layer 9, can not reach metal structures 2b, as a result of the combination of thin, SRO layers and shapes. Therefore the combination of SRO layers and shapes in addition to preventing corrosion of the copper or aluminum, metal structures, by fluorine radicals, also was maintained at a thickness thin enough to allow an adequate thickness of low k, FSG layer to fill the spaces between metal struties 2b.

While this invention has been particularly shown and described with reference to, the preferred embodiments thereof it will be understood by those skilled in the art that various changes in form and details may be made without departing from the spirit and scope of this invention.

What is claimied is:

1. A method of protecting metal structures, on a semiconductor substrate, from corrosive effects of an adjacent fluorinated silica glass, (FSG), layer, comprising the steps of:
    forming said metal structures on said semiconductor substrate, with each metal structure capped with an overlying, silicon rich oxide, (SRO), shape, and with said metal interconnect structures separated by a first space;
    forming SRO spacers on the sides of said SRO capped, metal structures, resulting in a second space located between said SRO capped, metal structures, coated with said SRO spacers;
    depositing a conformal SRO layer on: said SRO capped, metal structures; on SRO spacers; and on the bottom surface of said second space, resulting in a third space located between said metal structures, encapsulated by said overlying, SRO shape, by said SRO spacers, and by said conformal SRO layer; and
    depositing said FSG layer on said SRO capped, metal structures, and in said third space located between said SRO encapsulated metal structures.

2. The method of claim 1, wherein said metal structures are comprised of copper, at a thickness between about 6000 to 8000 Angstroms, with a copper layer obtained via plasma vapor deposition or electrochemical procedures, and patterned via an anisotropic, reactive ion etching, (RIE), procedure, using $Cl_2$ or $SF_6$ as an etchant.

3. The method of claim 1, wherein said metal structures are comprised of aluminum or aluminum—copper, at a thickness between about 6000 to 8000 Angstroms, with the aluminum, or aluminum—copper layer obtained via plasma vapor deposition procedures, and patterned via an anisotropic, reactive ion etching, (RIE), procedure, using $Cl_2$ or $SF_6$ as an etchant.

4. The method of claim 1, wherein said overlying, SRO shape is formed via deposition of a first SRO layer, at a thickness between about 300 to 500 Angstroms, using plasma enhanced chemical vapor deposition, (PECVD) or low pressure chemical vapor deposition, (LPCVD), procedures, then patterned via an anisotropic RIE procedure using $CHF_3$ or $CF_4$ as an etchant.

5. The method of claim 1, wherein said first space, located between said SRO capped, metal structures, is between about 0.15 to 0.25 um.

6. The method of claim 1, wherein said SRO spacers are formed via deposition of a second SRO layer, at a thickness between about 150 to 300 Angstroms, followed by a blanket, anisotropic RIE procedure, using $CHF_3$ or $CF_4$ as an etchant.

7. The method of claim 1, wherein said second space, located between said SRO capped, metal structures, with said SRO spacers, is between about 0.12 to 0.22 um.

8. The method of claim 1, wherein said SRO layer is obtained via LPCVD or PECVD procedures, at a thickness between about 150 to 300 Angstroms.

9. The method of claim 1, wherein said third space, located between said SRO encapsulated metal structures, is between about 0.10 to 0.19 um.

10. The method of claim 1, wherein said FSG layer is obtained via PECVD or PECVD procedures, at a thickness between about 5000 to 8000 Angstroms, with a dieletric constant between about 2 to 3.

11. A method of forming silicon rich oxide, (SRO), encapsulated metal structures, on a semiconductor substrate, featuring a low dielectric constant, (low k), fluorinated silica glass, (FSG), filling the spaces between said SRO encapsulated metal structures, comprising the steps of:
    depositing a metal layer on an underlying conductive region of said semiconductor substrate;
    depositing a first SRO layer on said metal layer;
    patterning of said first SRO layer, and of said metal layer to form SRO capped, metal structures, with a first space located between said SRO capped, metal structures;
    depositing a second SRO layer;
    performing a blanket, anisotropic RIE procedure to form SRO spacers on the sides of said SRO capped, metal structures, resulting in a second space between said SRO capped, metal, structures, now comprised with said SRO spacers;

depositing a third SRO layer on: said SRO capped, metal structures; on said SRO spacers; and on bottom surface of said second space, creating said SRO encapsulated metal structures, and creating a third space between said SRO encapsulated metal structures; and depositing said low k FSG layer on said SRO encapsulated metal structures and in said third space located between said SRO encapsulated metal structures.

12. The method of claim 11, wherein said metal layer is a copper layer, obtained via plasma vapor deposition or via electrochemical procedures, to a thickness between about 6000 to 8000 Angstroms.

13. The method of claim 11, wherein said metal layer is an aluminum or an aluminum—copper layer, obtained via plasma vapor deposition procedures at a thickness between about 6000 to 8000 Angstroms.

14. The method of claim 11, wherein said first SRO layer is obtained via LPCVD or PECVD procedures, to a thickness between about 300 to 5000 Angstroms.

15. The method of claim 11, wherein said SRO capped, metal structures are formed via an anisotropic RIE, patterning procedure, using $CHF_3$ of $CF_4$ as an etchant for said first SRO layer, and using $Cl_2$ or $SF_6$ as an etchant for said metal layer.

16. The method of claim 11, wherein said first space, located between said SRO capped, metal structures, is between about 0.15 to 0.25 um.

17. The method of claim 11, wherein said second SRO layer is obtained via LPCVD or PECVD procedures, at a thickness between about 150 to 300 Angstroms.

18. The method of claim 11, wherein said SRO spacers are formed via said blanket, anisotropic RIE procedure, using $CHF_3$ or $CF_4$ as an etchant.

19. The method of claim 11, wherein said second space, located between said SRO capped, metal structures, with said SRO spacers, is between about 0.12 to 0.22 um.

20. The method of claim 11, wherein said third SRO layer is obtained via LPCVD or PECVD procedures, at a thickness between about 150 to 300 Angstroms.

21. The method of claim 11, wherein said third space, located between said encapsulated SRO metal structures, is between about 0.10 to 0.19 um.

22. The method of claim 11, wherein said low k FSG layer is obtained via PECVD or PECVD procedures, at a thickness between about 5000 to 8000 Angstroms, with a dielectric constant for said low k FSG layer between about 2 to 3.

* * * * *